US008279145B2

(12) United States Patent
Cok et al.

(10) Patent No.: US 8,279,145 B2
(45) Date of Patent: Oct. 2, 2012

(54) CHIPLET DRIVER PAIRS FOR TWO-DIMENSIONAL DISPLAY

(75) Inventors: Ronald S. Cok, Rochester, NY (US); John W. Hamer, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 593 days.

(21) Appl. No.: 12/372,132

(22) Filed: Feb. 17, 2009

(65) Prior Publication Data
US 2010/0207851 A1   Aug. 19, 2010

(51) Int. Cl.
*G09G 3/32* (2006.01)
(52) U.S. Cl. .................. 345/82; 345/204; 345/76
(58) Field of Classification Search .......... 345/204, 345/76, 82
See application file for complete search history.

(56) References Cited

U.S. PATENT DOCUMENTS

| | | | |
|---|---|---|---|
| 4,769,292 A | 9/1988 | Tang | |
| 5,061,569 A | 10/1991 | VanSlyke et al. | |
| 6,384,529 B2 | 5/2002 | Tang | |
| 6,919,681 B2 | 7/2005 | Cok et al. | |
| 6,987,355 B2 | 1/2006 | Cok | |
| 7,230,594 B2 | 6/2007 | Miller et al. | |
| 7,585,703 B2* | 9/2009 | Matsumura et al. | 438/128 |
| 7,710,022 B2* | 5/2010 | Cok et al. | 313/505 |
| 7,830,002 B2* | 11/2010 | Cok et al. | 257/723 |
| 7,999,454 B2* | 8/2011 | Winters et al. | 313/500 |
| 8,125,418 B2* | 2/2012 | Cok | 345/76 |
| 8,207,954 B2* | 6/2012 | Cok et al. | 345/205 |
| 2002/0053881 A1* | 5/2002 | Odake et al. | 315/169.1 |
| 2004/0239586 A1* | 12/2004 | Cok | 345/55 |
| 2006/0055864 A1 | 3/2006 | Matsumura et al. | |
| 2007/0057263 A1 | 3/2007 | Kahen | |
| 2010/0039030 A1* | 2/2010 | Winters et al. | 313/505 |
| 2010/0107849 A1* | 5/2010 | Shaffer | 84/293 |
| 2010/0109166 A1* | 5/2010 | Cok et al. | 257/776 |
| 2010/0123694 A1* | 5/2010 | Cok et al. | 345/206 |
| 2010/0207848 A1* | 8/2010 | Cok | 345/76 |
| 2010/0207849 A1* | 8/2010 | Cok et al. | 345/76 |
| 2010/0207852 A1* | 8/2010 | Cok | 345/83 |
| 2010/0265224 A1* | 10/2010 | Cok | 345/206 |
| 2010/0277440 A1* | 11/2010 | Cok | 345/204 |

OTHER PUBLICATIONS

Yoon et al, A novel use of MEMS switches in driving AMOLED, digest of Technical Papers of the Society for Information Display, 2008, 3.4, p. 13.

* cited by examiner

*Primary Examiner* — Bipin Shalwala
*Assistant Examiner* — Afroza Chowdhury
(74) *Attorney, Agent, or Firm* — Morgan, Lewis & Bockius LLP

(57) ABSTRACT

A display device, including a substrate; a first layer having an array of row electrodes formed in rows across the substrate in a first direction and a second layer having an array of column electrodes formed in columns across the substrate in a second direction different from the first direction wherein the row and column electrodes overlap to form pixel locations; one or more layers of light-emitting material formed between the row and column electrodes to form a two-dimensional array of pixels, the pixels being located in the pixel locations; and a plurality of row driver chiplets and a separate plurality of column driver chiplets distributed relative to the two-dimensional array of pixels, each row driver chiplet exclusively connected to and controlling an independent set of row electrodes and each column driver chiplet exclusively connected to and controlling an independent set of column electrodes.

27 Claims, 12 Drawing Sheets

CHIPLET DRIVER PAIRS FOR TWO-DIMENSIONAL DISPLAY

CROSS-REFERENCE TO RELATED APPLICATION

Reference is made to commonly-assigned U.S. patent application Ser. No. 12/191,462 filed Aug. 14, 2008, entitled "Display Device With Chiplets" by Ronald S. Cok et al, the disclosure of which is incorporated herein.

FIELD OF THE INVENTION

The present invention relates to display devices having a substrate with distributed, independent chiplets for controlling a pixel array.

BACKGROUND OF THE INVENTION

Flat-panel display devices are widely used in conjunction with computing devices, in portable devices, and for entertainment devices such as televisions. Such displays typically employ a plurality of pixels distributed over a substrate to display images. Each pixel incorporates several, differently colored light-emitting elements commonly referred to as sub-pixels, typically emitting red, green, and blue light, to represent each image element. As used herein, pixels and sub-pixels are not distinguished and refer to a single light-emitting element. A variety of flat-panel display technologies are known, for example plasma displays, liquid crystal displays, and light-emitting diode (LED) displays.

Light emitting diodes (LEDs) incorporating thin films of light-emitting materials forming light-emitting elements have many advantages in a flat-panel display device and are useful in optical systems. U.S. Pat. No. 6,384,529 to Tang et al. shows an organic LED (OLED) color display that includes an array of organic LED light-emitting elements. Alternatively, inorganic materials can be employed and can include phosphorescent crystals or quantum dots in a polycrystalline semiconductor matrix. Other thin films of organic or inorganic materials can also be employed to control charge injection, transport, or blocking to the light-emitting-thin-film materials, and are known in the art. The materials are placed upon a substrate between electrodes, with an encapsulating cover layer or plate. Light is emitted from a pixel when current passes through the light-emitting material. The frequency of the emitted light is dependent on the nature of the material used. In such a display, light can be emitted through the substrate (a bottom emitter) or through the encapsulating cover (a top emitter), or both.

LED devices can comprise a patterned light-emissive layer wherein different materials are employed in the pattern to emit different colors of light when current passes through the materials. Alternatively, one can employ a single emissive layer, for example, a white-light emitter, together with color filters for forming a full-color display, as is taught in U.S. Pat. No. 6,987,355 by Cok. It is also known to employ a white sub-pixel that does not include a color filter, for example, as taught in U.S. Pat. No. 6,919,681 by Cok et al. A design has been taught employing an unpatterned white emitter together with a four-color pixel including red, green, and blue color filters and sub-pixels and an unfiltered white sub-pixel to improve the efficiency of the device (see, e.g. U.S. Pat. No. 7,230,594 to Miller, et al).

Two different methods for controlling the pixels in a flat-panel display device are generally known: active-matrix control and passive-matrix control. In a passive-matrix device, the substrate does not include any active electronic elements (e.g. transistors). An array of row electrodes and an orthogonal array of column electrodes in a separate layer are formed over the substrate; the overlapping intersections between the row and column electrodes form the electrodes of a light-emitting diode. External driver chips then sequentially supply current to each row (or column) while the orthogonal column (or row) supplies a suitable voltage to illuminate each light-emitting diode in the row (or column). Therefore, a passive-matrix design employs 2n connections to produce $n^2$ separately controllable light-emitting elements. However, a passive-matrix drive device is limited in the number of rows (or columns) that can be included in the device since the sequential nature of the row (or column) driving creates flicker. If too many rows are included, the flicker can become perceptible. Moreover, the currents necessary to drive an entire row (or column) in a display can be problematic the power required for the non-imaging pre-charge and discharge steps of PM driving become dominant as the area of the PM display grows. These problems limit the physical size of a passive-matrix display.

In an active-matrix device, active control elements are formed of thin films of semiconductor material, for example amorphous or poly-crystalline silicon, coated over the flat-panel substrate. Typically, each sub-pixel is controlled by one control element and each control element includes at least one transistor. For example, in a simple active-matrix organic light-emitting (OLED) display, each control element includes two transistors (a select transistor and a power transistor) and one capacitor for storing a charge specifying the luminance of the sub-pixel. Each light-emitting element typically employs an independent control electrode and an electrode electrically connected in common. Control of the light-emitting elements is typically provided through a data signal line, a select signal line, a power connection and a ground connection. Active-matrix elements are not necessarily limited to displays and can be distributed over a substrate and employed in other applications requiring spatially distributed control. The same number of external control lines (except for power and ground) can be employed in an active-matrix device as in a passive-matrix device. However, in an active-matrix device, each light-emitting element has a separate driving connection from a control circuit and is active even when not selected for data deposition so that flicker is eliminated.

One common, prior-art method of forming active-matrix control elements typically deposits thin films of semiconductor materials, such as silicon, onto a glass substrate and then forms the semiconductor materials into transistors and capacitors through photolithographic processes. The thin-film silicon can be either amorphous or polycrystalline. Thin-film transistors (TFTs) made from amorphous or polycrystalline silicon are relatively large and have lower performance compared to conventional transistors made in crystalline silicon wafers. Moreover, such thin-film devices typically exhibit local or large-area non-uniformity across the glass substrate that results in non-uniformity in the electrical performance and visual appearance of displays employing such materials. In such active-matrix designs, each light-emitting element requires a separate connection to a driving circuit.

Employing an alternative control technique, Matsumura et al., in U.S. Patent Application Publication No. 2006/0055864, describe crystalline silicon substrates used for driving LCD displays. The application describes a method for selectively transferring and affixing pixel-control devices made from first semiconductor substrates onto a second planar display substrate. Wiring interconnections within the pixel-control device and connections from busses and control electrodes to the pixel-control device are shown.

Since a conventional passive-matrix display design is limited in size and number of light-emitting elements, and an active-matrix design using TFTs has lower electrical performance, there is a need for an improved control method for display devices employing LEDs that overcomes these problems.

SUMMARY OF THE INVENTION

In accordance with the present invention, there is provided a display device, comprising:

(a) a substrate;

(b) a first layer having an array of row electrodes formed in rows across the substrate in a first direction and a second layer having an array of column electrodes formed in columns across the substrate in a second direction different from the first direction wherein the row and column electrodes overlap to form pixel locations;

(c) one or more layers of light-emitting material formed between the row and column electrodes to form a two-dimensional array of pixels, the pixels being located in the pixel locations; and (d) a plurality of row driver chiplets and a separate plurality of column driver chiplets distributed relative to the two-dimensional array of pixels, each row driver chiplet exclusively connected to and controlling an independent set of row electrodes and each column driver chiplet exclusively connected to and controlling an independent set of column electrodes.

The present invention has the advantage that, by providing a display device having a plurality of pixels associated into two-dimensional arrays, each two-dimensional array having distributed, separate row and column chiplet drivers, performance is improved and the number of components and connections is reduced. Further, by having separate row and column driver chiplets, each chiplet can be made with the lowest cost semiconductor fabrication process available for each chiplet.

Figure 1A:
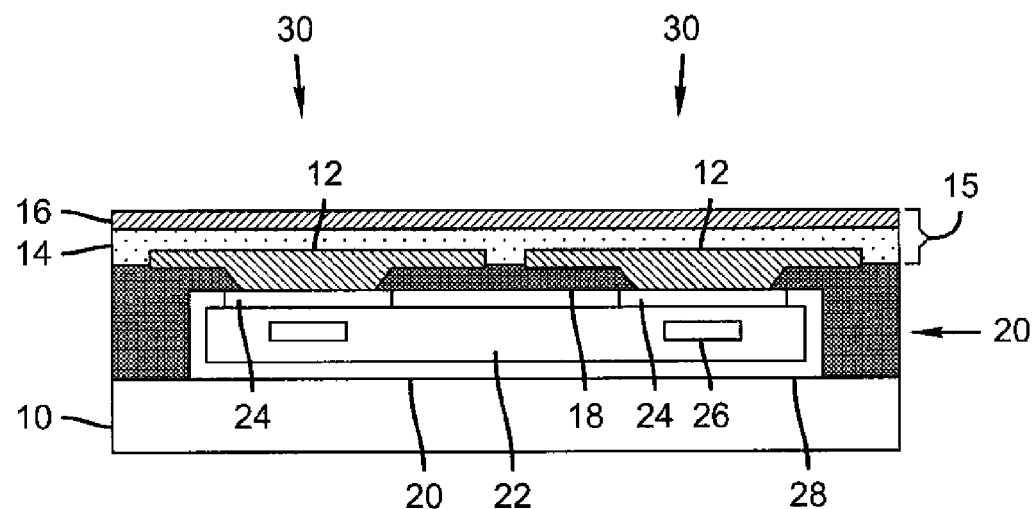
FIG. 1A is a cross-section of a chiplet having two connections to the bottom electrodes of light-emitting diodes according to an embodiment of the present invention.

Because the various layers and elements in the drawings have greatly different sizes, the drawings are not to scale.

DETAILED DESCRIPTION OF THE INVENTION

Figure 3:
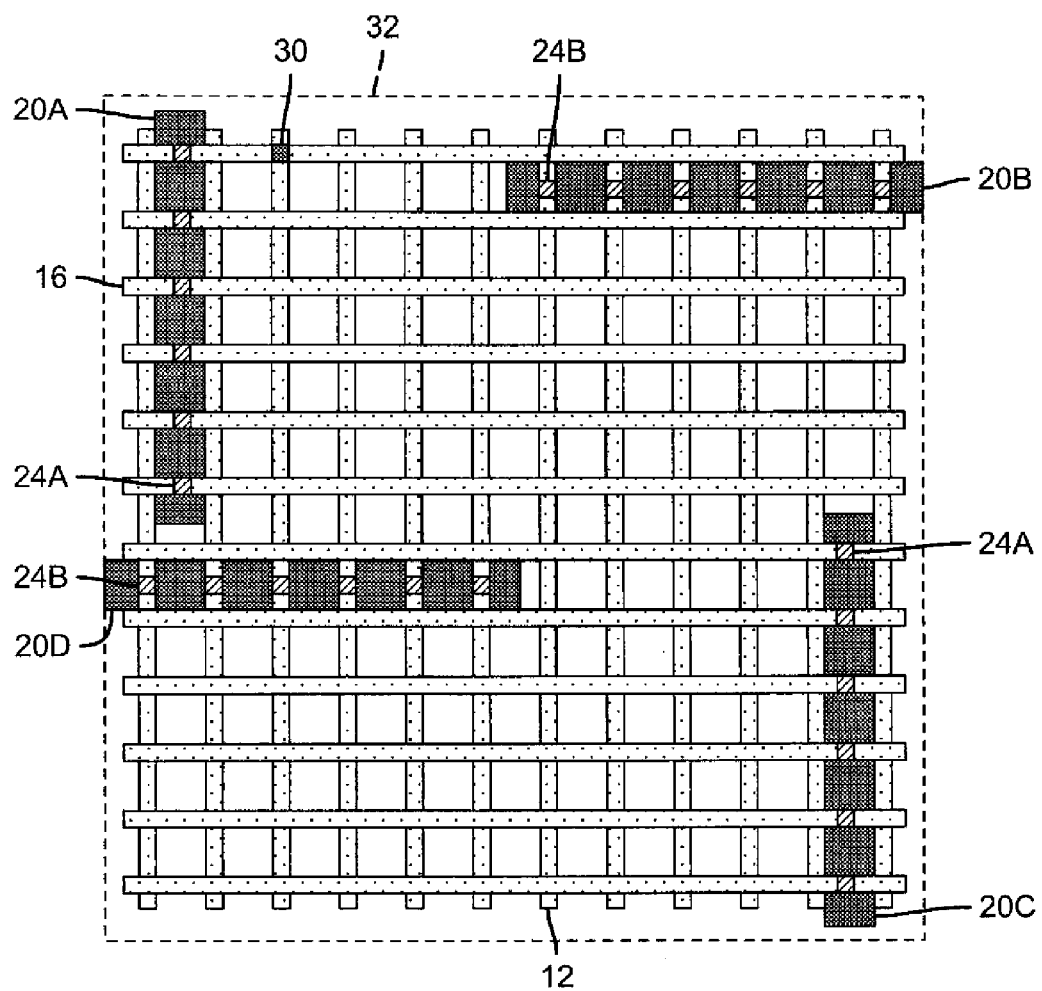
FIG. 3 is a schematic of an array of pixels in a pixel group driven by two row driver chiplets and two column driver chiplets according to an embodiment of the present invention.

Referring to FIGS. 3 and 1A, in one embodiment of the present invention, a display device includes a substrate 10 and a first layer having an array of row electrodes 16 formed in rows across the substrate 10 in a first direction and a second layer having an array of column electrodes 12 formed in columns across the substrate 10 in a second direction different from the first direction. Pixel 30 locations are formed over the substrate 10, where the row and column electrodes 16, 12 overlap. One or more layers 14 of light-emitting material are formed between the row and column electrodes 16, 12 to form a two-dimensional array of pixels 30 in the pixel locations. A plurality of row driver chiplets 20A, 20C and a separate plurality of column driver chiplets 20B, 20D are distributed relative to the substrate 10, each row driver chiplet 20A, 20C exclusively connected to and controlling an independent set of row electrodes 16 and each column driver chiplet 20B, 20D exclusively connected to and controlling an independent set of column electrodes 12. The chiplets are distributed relative to the pixel array so that, as intended herein, the chiplets are located within the pixel array, for example above, below, or adjacent to the light-emitting elements in the light-emitting area of the display and are not located exclusively around the periphery of the two-dimensional pixel array. For example, the chiplets can be distributed over the substrate and located in a layer beneath the pixels, between the pixels and the substrate. Alternatively, the chiplets can be located over the substrate adjacent to and interspersed between the pixels in a common layer, or in layers above or below the pixels.

Referring to FIG. 1A, light-emitting diodes 15 include one or more layers 14 of light-emitting formed between the row and column electrodes 16, 12 to form a plurality of pixels 30, each pixel 30 located where the row and column electrodes 16, 12 overlap. Pixels can be subpixels that emit different colors of light (e.g. red, green, blue, or white) to form a full-color display in response to a current passed through the one or more layers 14 of light-emitting material by the row and column electrodes 16, 12. In this disclosure, pixels, subpixels, and light-emitting elements all refer to a light-emitting diode 15. However, pixels can also include light-controlling or switching material controlled by electrodes and are included in the present invention.

A plurality of chiplets 20, both row driver chiplets 20A and column driver chiplets 20B, are located over the substrate 10, the number of chiplets 20 being less than the number of pixels 30. Each chiplet has a substrate 28 that is independent and separate from the display device substrate 10. As used herein, distributed relative to the substrate 10 means that the chiplets 20 are not located solely around the periphery of the pixel array but are located within the display area, that is, beneath, above, or between pixels in the light-emitting area of the display.

Figure 2:
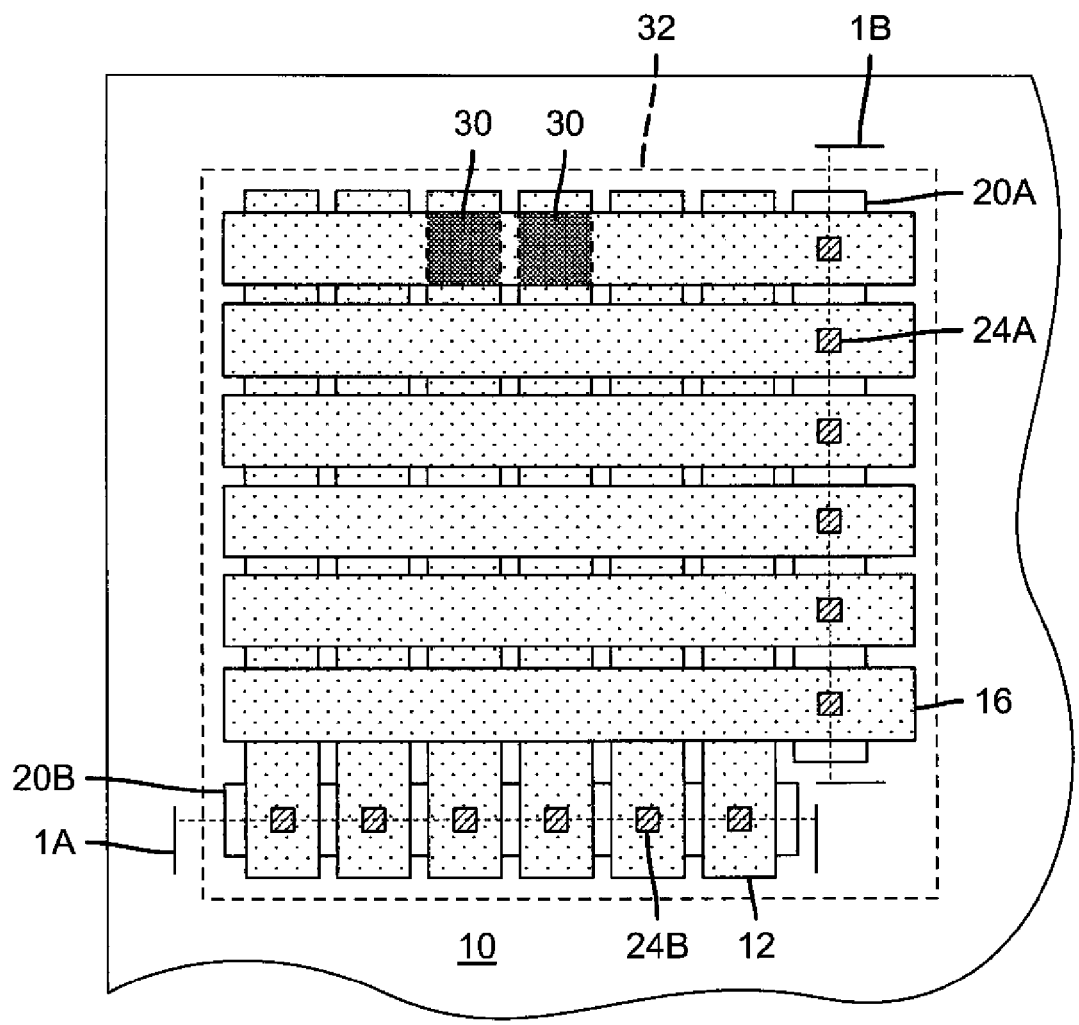
FIG. 2 is a schematic of an array of pixels in a pixel group driven by a row driver chiplet and a column driver chiplet according to a simplified illustration of an embodiment of the present invention.
Figure 4:
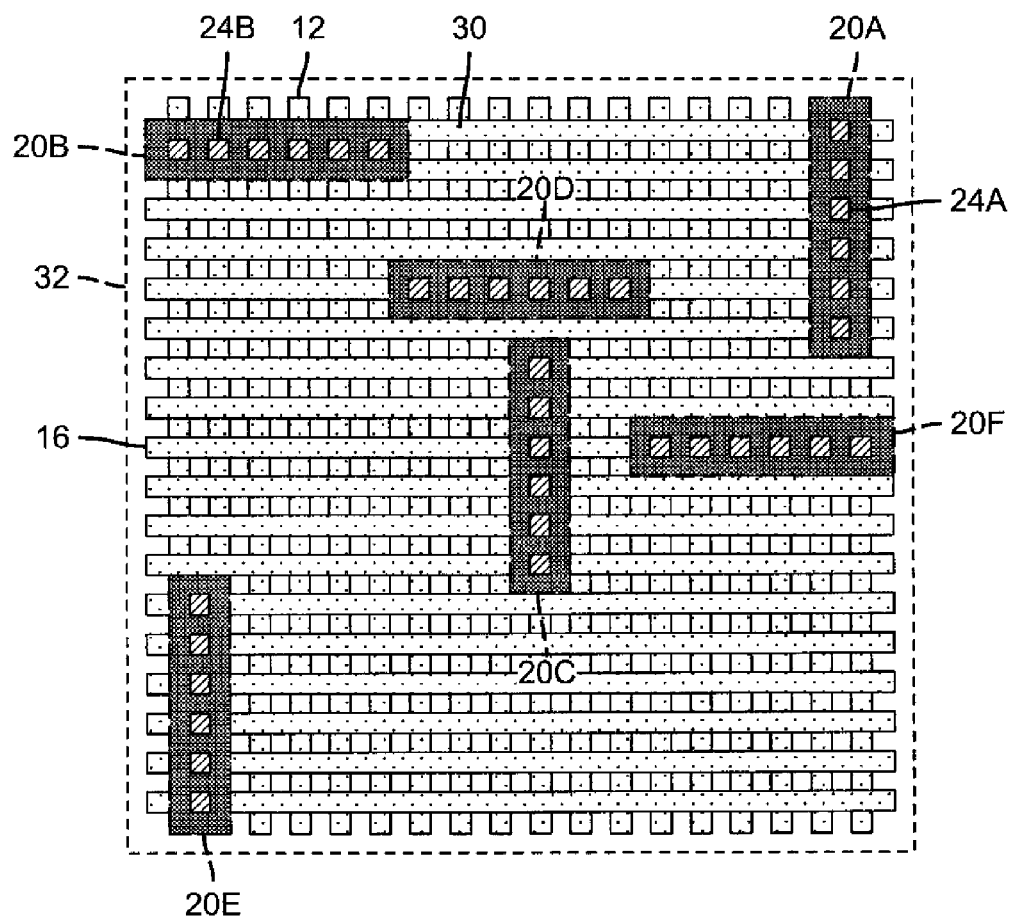
FIG. 4 is a schematic of an array of pixels in a pixel group driven by three row driver chiplets and three column driver chiplets according to an embodiment of the present invention.

The pixels 30 in the array can be subdivided into mutually exclusive pixel groups 32, each pixel group 32 typically having a rectangular arrangement of pixels 30. Each pixel group has a separate array of group row electrodes and a separate array of group column electrodes that are electrically independent from the group row electrodes and group column electrodes of any other pixel group. Each pixel group has one or more separate group row driver chiplets and one or more separate group column driver chiplets located over the substrate, each group row driver chiplet exclusively connected to and controlling pixel group row electrodes and each group column driver chiplet exclusively connected to and controlling pixel group column electrodes. By exclusively connected to and controlling is meant that each group column electrode is connected to only one group column driver chiplet. Likewise, each group row electrode is connected to only one group row driver chiplet. FIGS. 2, 3 and 4 illustrate a single pixel group 32; FIGS. 5, 8, 9, and 11 illustrate multiple pixel groups. In an alternative embodiment, a row driver chiplet can be connected to two or more independent sets of row electrodes or a column driver chiplet can be connected to two or more independent sets of column electrodes. A chiplet thus drives the row or column electrodes of two or more pixel groups.

Each chiplet 20 can include circuitry 22 for controlling the pixels 30 to which the chiplet 20 is connected through connection pads 24. The circuitry 22 can include storage elements 26 that store a value representing a desired luminance for each pixel 30 to which the chiplet 20 is connected in a row or column, the chiplet 20 using such value to control either the row electrodes 16 or the column electrodes 12 connected to the pixel 30 to activate the pixel 30 to emit light. For example, if a row driver chiplet 20A is connected to 8 rows and a column driver chiplet 20B is connected to 8 columns, eight storage elements 26 can be employed to store luminance information for the 8 pixels connected to the row or column driver chiplet in one row or column. When a row or column is activated by an external controller, luminance information can be supplied to the corresponding chiplet 20. In one embodiment of the present invention, two storage elements 26 can be employed for each row or column connected to a chiplet, so that luminance information can be stored in one of the storage elements 26 while the other storage element 26 is employed to display luminance information. In yet another embodiment of the present invention, one or two storage elements 26 can be employed for each light-emitting pixel 30 to which the chiplet 20 is connected.

Figure 1B:
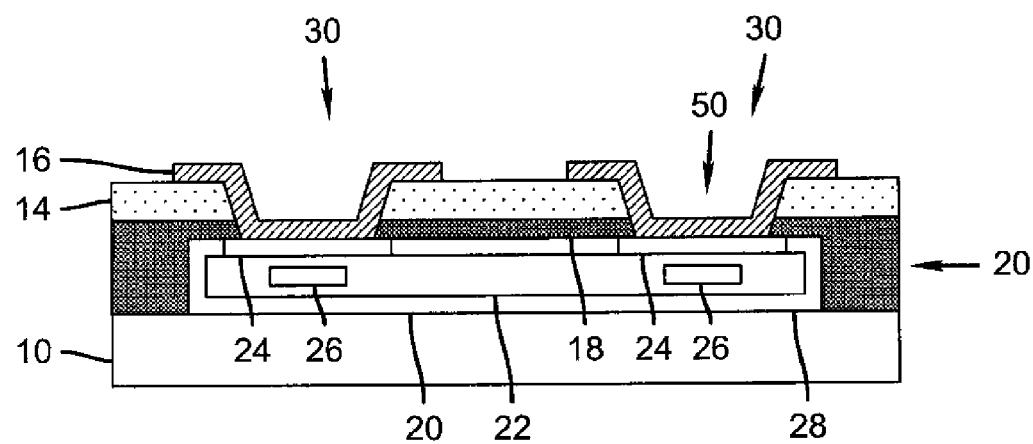
FIG. 1B is a cross-section of a chiplet having two connections to the top electrodes of light-emitting diodes according to an embodiment of the present invention.

A planarization layer 18 can be employed to form a smooth surface over which the row and column electrodes 16, 12, and the light-emitting layer 14 can be formed. As shown in FIG. 1A, the connection pads 24 of the chiplet 20 can connect to the bottom electrode of the light-emitting diode 15, here shown as the column electrode 12 and indicated with cross section line 1A in FIG. 2. Alternatively, as shown in FIG. 1B, the connection pads 24 of the chiplet 20 can connect to the top electrode of the light-emitting diode, here shown as the row electrode 16 and indicated with cross section line 1B in FIG. 2. In this way, the connection pads of a chiplet 20 can connect to either row electrodes 16 or column electrodes 12. In FIG. 2 the connection pads of chiplet 20B are distinguished as column connection pads 24B connected to column electrodes 12. The connection pads of chiplet 20A are distinguished as row connection pads 24A connected to row electrodes 16. FIG. 2 is a simplified figure drawn for illustrative purposes and omits the row and column electrodes 16, 20 that can be formed directly above the chiplets 20.

FIG. 3 illustrates the use of two row driver chiplets 20A, 20C and two column driver chiplets 20B, 20D within a pixel group 32. As shown in FIG. 3 the row and column connection pads 24A and 24B are carefully laid out on the substrate 10 to avoid electrical shorts between the row and column electrodes 16, 12, by providing enough space between the row connection pads 24A and the column electrodes 12 and by providing enough space between the column connection pads 24B and the row electrodes 16. In an exemplary embodiment shown in FIG. 4, three row driver chiplets 20A, 20C, 20E and three column driver chiplets 20B, 20D, 20F are employed. (The chiplets are shown in dotted lines above the electrodes for clarity, rather than below; also in FIG. 11.) The column connection pads 24B can be covered with row electrodes 16 to increase the overlapping area defining the pixel 30, thereby increasing the aperture ratio of the display device and the lifetime of the display. Depending on the tolerances of the manufacturing process used to construct the present invention, the column electrodes 12 can be increased in size so long as there is not an electrical short between the column electrodes 12 and the row connection pads 24A and row electrodes 16, thereby improving the device aperture ratio.

Referring to FIG. 4, an embodiment of a display device of the present invention can include multiple chiplets (20A-20D) distributed over the pixel group 32 formed by the intersections of row and column electrodes 16, 12. Each chiplet 20 is connected to a mutually exclusive subset of row electrodes 16 and column electrodes 12. As shown in FIG. 4, chiplet 20A is connected to the top 6 row electrodes 16 in the pixel group 32. Chiplet 20C is connected to the central 6 row electrodes 16 in the pixel group 32. Chiplet 20E is connected to the bottom 6 row electrodes 16 in the pixel group 32. Chiplet 20B is connected to the left-most 6 column electrodes 12 in the pixel group 32. Chiplet 20D is connected to the central 6 column electrodes 12 in the pixel group 32. Chiplet 20F is connected to the right-most 6 column electrodes 12 in the pixel group 32. Hence, the pixel group 32 has 18 by 18 or 324 elements controlled by six chiplets with 6 connection pads each. A careful examination of FIG. 4 shows that each chiplet controls a separate group of row or column electrodes 16, 12.

Figure 5:
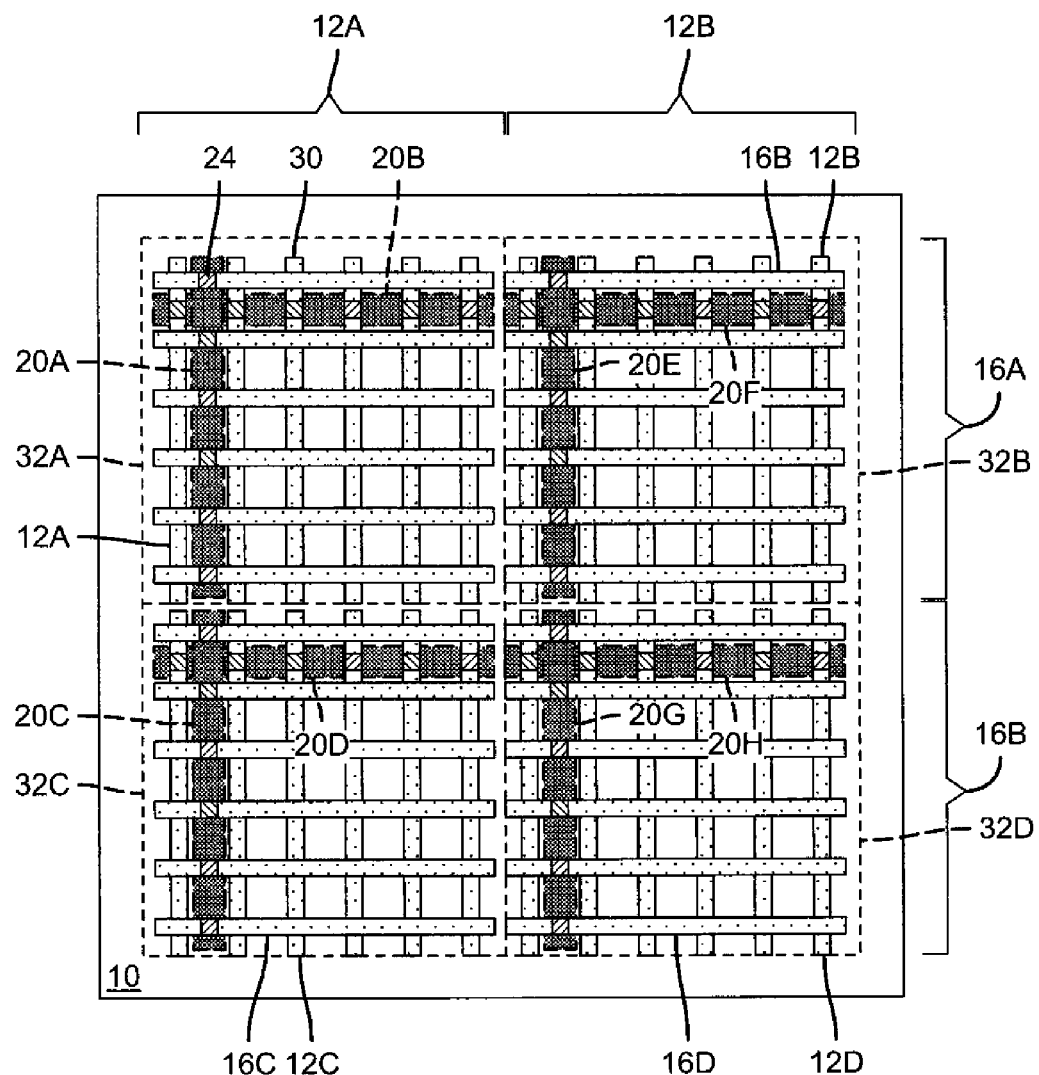
FIG. 5 is a schematic of a display device having a pixel array divided into mutually exclusive pixel groups, each group including a row driver chiplet and a column driver chiplet according to a simplified illustration of an embodiment of the present invention.
Figure 7A:
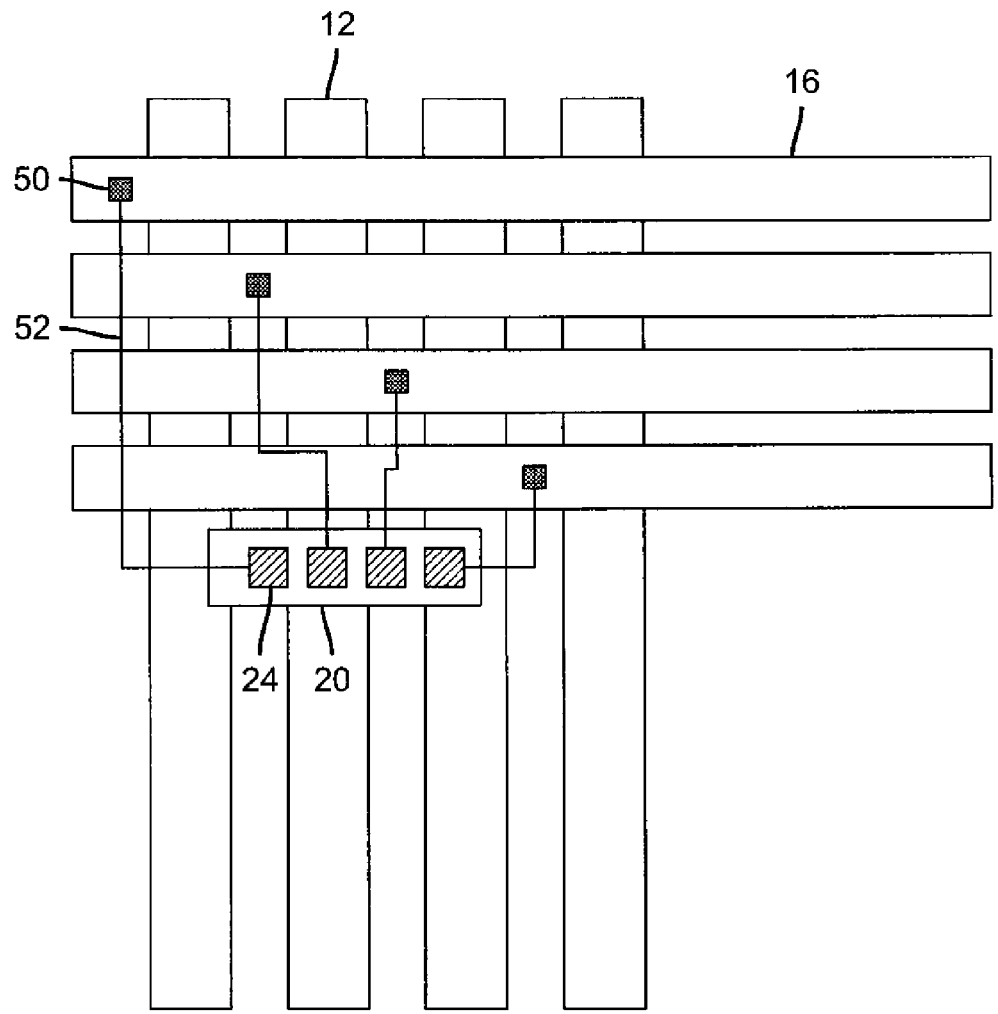
FIGS. 7A-7C are illustrations of various connections between chiplet connection pads and row electrodes according to various embodiments of the present invention.

FIG. 5 is a more detailed illustration with four pixel arrays 32A, 32B, 32C, 32D, having only two chiplets per pixel array. These pixel arrays are pixel groups formed by the intersection of row and column electrodes. The pixels in pixel array 32A are driven by group row electrodes 16A and group column electrodes 12A. The group row electrodes 16A are driven by row driver chiplet 20A and the group column electrodes 12A are driven by column driver chiplet 20B. The pixels in pixel array 32B are driven by group row electrodes 16B and group column electrodes 12B. The group row electrodes 16B are driven by row driver chiplet 20E and the group column electrodes 12B are driven by column driver chiplet 20F. The pixels in pixel array 32C are driven by group row electrodes 16C and group column electrodes 12C. The group row electrodes 16C are driven by row driver chiplet 20C and the group column electrodes 12C are driven by column driver chiplet 20D. The pixels in pixel array 32D are driven by group row electrodes 16D and group column electrodes 12D. The group row electrodes 16D are driven by row driver chiplet 20G and the group column electrodes 12D are driven by column driver chiplet 20H. None of the group electrodes in one pixel group are electrically connected to the group electrodes in another pixel group. For simplicity, the row and column driver chiplets in each pixel group are illustrated as overlapping. In a practical embodiment, the chiplets would not overlap but, as shown in FIG. 7A, have connection pads 24 connected to the electrodes with routed wires 52. The chiplets can have a long dimension D1 and a short dimension D2 and the long dimension D1 can be parallel to the first direction or the second direction (FIG. 10B) of the row or column electrodes, respectively.

The present invention provides reduced costs over the prior art. For example, if a conventional, active-matrix backplane were employed to drive the 324 pixels 30 of FIG. 4, a relatively low-performance and expensive thin-film semiconductor backplane would be necessary. If an alternative chiplet design described in commonly assigned, above-cited U.S. patent application Ser. No. 12/191,462 were employed, 12 pixels 30 can be driven by each chiplet so that 27 chiplets would be required. In contrast, the present invention requires only six chiplets.

The row driver chiplets need not have the same circuitry as the column driver chiplets, the same number of connection pads, or the same layout of connection pads. Moreover, the number of rows that the row driver chiplets drive need not be the same as the number of columns that the column driver chiplets drive. Although the pixel arrays are illustrated as square (the number of row electrodes is the same as the number of column electrodes) the pixel groups (or the entire pixel array) or the pixels, need not be square. Hence, the number of row driver chiplets need not be the same as the number of column driver chiplets. Moreover, the row driver and column driver chiplets can be located in a wide variety of locations, so long as they are electrically connected to the corresponding row or column electrodes. For example, in FIG. 4, the column driver chiplets can be moved along columns and the row driver chiplets can be moved along rows, as desired. Locations are generally selected to provide routing paths for electrical connections to chiplets and to space the chiplets from each other at a required positional tolerance suitable for the manufacturing process employed. Moreover, the technology, processes, or construction of row driver chiplets can be different from the technology, processes, or construction of column driver chiplets. By construction is meant the process limitations, materials, and manufacturing processes employed to construct the row and column driver chiplets. For example, one chiplet can employ digital designs, processes, and materials and the other can employ analog. Alternatively, one chiplet can employ relatively high-voltage designs, processes, and materials and the other relatively low-voltage. Again, one chiplet can employ semiconductor substrate materials or doping (e.g. n- or p-doping) and the other different materials or doping. The chiplets can also employ different circuit schematics. The chiplet controlling the independent drive direction requires circuitry to receive image data, requires one or more memory locations for image data per output, and controls relatively small currents and functions better when implemented with smaller line-width semiconductor processes. The chiplet controlling the common drive direction does not receive image data or require image data memory, but is required to switch relatively large currents and therefore functions better when implemented with wider line-width semiconductor processes.

In a further embodiment of the present invention, the chiplet connection pads 24 are not directly connected to a row or column electrode. Such connections can cause the chiplets 20 to be larger than necessary. Referring to FIG. 7A, in another embodiment of the present invention, the chiplets 20 can be aligned in any orientation with respect to the pixel groups 32 and substrate 10, including aligning an edge of a chiplet 20 with a row or column electrode 16 or 12. Indeed, different chiplets 20 can be differently aligned. As shown in FIG. 7A, a long dimension of a chiplet 20 is aligned with row electrodes 16. Moreover, a display device can include a plurality of row driver chiplets and a separate plurality of column driver chiplets distributed over the substrate, each chiplet having a long dimension and a short dimension, the long dimension of the row driver chiplet orthogonal to the long dimension of the column driver chiplet. Such an arrangement facilitates the routing of busses in a single layer, for example a metal layer.

Connection pads 24 are connected with wiring 52 to the row electrodes 16. Vias 50 (also shown in FIG. 1B) can be employed to connect from one wiring layer to another and are formed between, for example, the column electrodes 12 to avoid electrical shorts with the column electrodes 12. Since considerable wiring 52 can be necessary to electrically connect the connection pads 24 to the row and column electrodes 16, 12, a top emitter configuration can be preferred, in which the top electrode (e.g. 16 in FIGS. 1A and 1B) is transparent and the bottom electrode (e.g. 12 in FIGS. 1A and 1B) can be reflective. The substrate 10 can also be opaque.

Figure 6A:
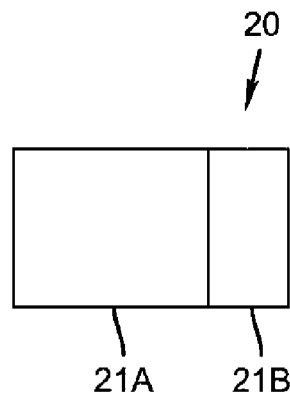
FIGS. 6A and 6B are schematics of chiplets having at least one pixel connection portion and at least one circuitry portion according to alternative embodiments of the present invention.
Figure 6B:
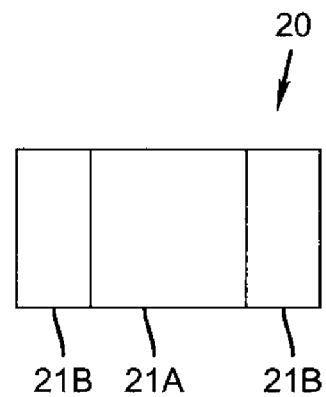
Figure 7B:
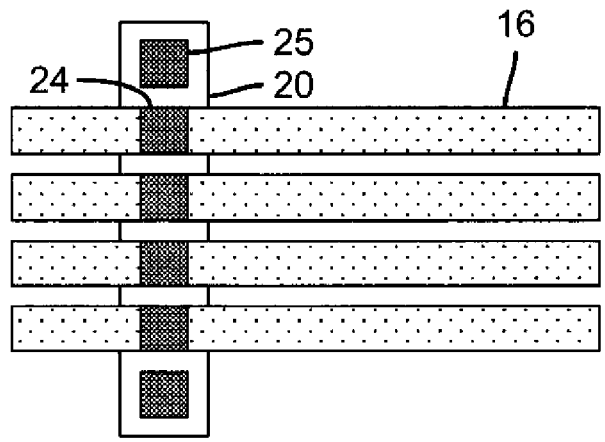
Figure 7C:
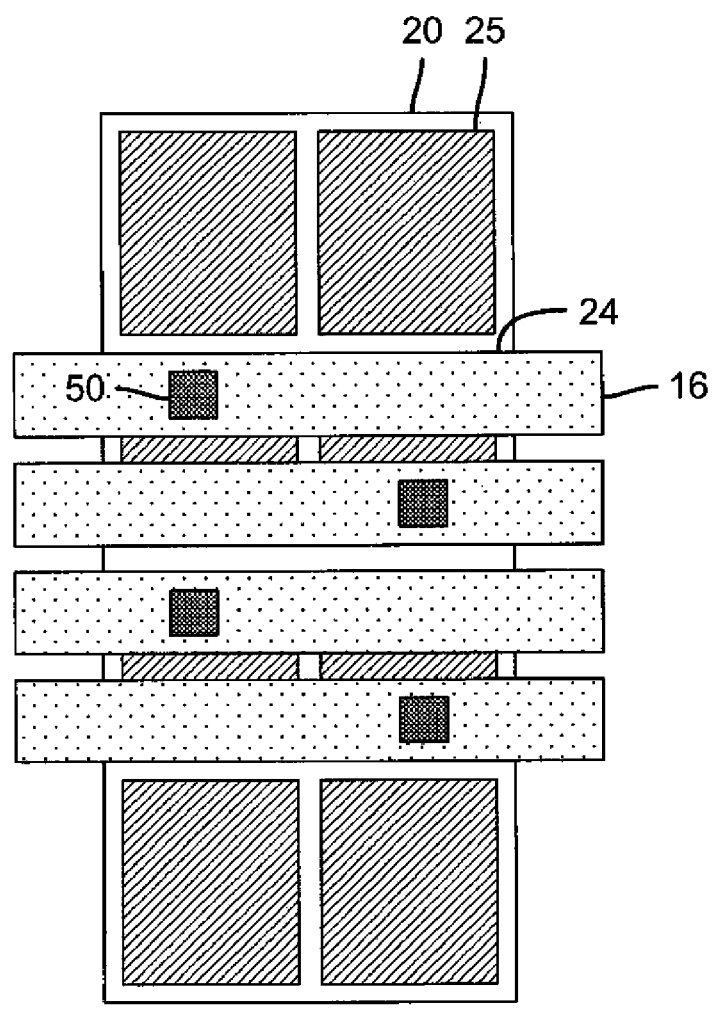
Figure 10A:
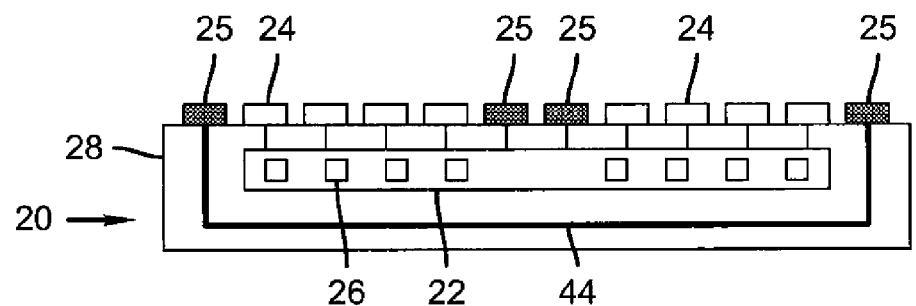
FIG. 10A is a cross section of a chiplet having different connection pads according to another embodiment of the present invention.
Figure 10B:
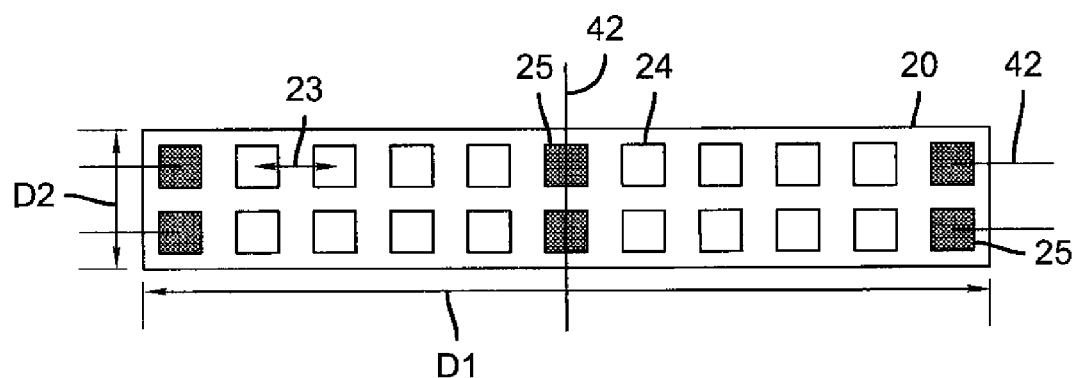
FIG. 10B is a top view of FIG. 10A in an embodiment of the present invention.

Referring to FIG. 6A, the chiplets 20 can have a pixel connection portion 21A at one end of the chiplet 20 and a circuitry portion 21B connected to a buss at the other end. Referring to FIGS. 6B and 7B, the chiplets 20 can have circuitry connection portions 21B at each end of the chiplet 20 connected to a buss 42 through a buss connection pad 25 and a pixel connection portion 21B in the middle. Alternatively, no separate portions can be employed. FIG. 7C illustrates the case wherein the connection pads 24 are larger than the electrodes 12, 16 or wires 52 and a via 50 is employed to connect the connection pad 24 to the row electrode 16. Referring to FIG. 10A, additional connection pads 25 for connecting to a buss 42 can also be provided in the chiplet 20 and can be located at a circuitry portion of a chiplet or at either end of a chiplet 20, or in the center of the chiplet 20. Internal chiplet connections 44 can be employed to route buss connections from one end of a chiplet 20 to another end. Referring to FIGS. 10A and 10B, each chiplet can have a first group of connection pads 24 connected to the row or column electrodes and second group of connection pads 25 connected to a control buss, wherein the first and second groups of connection pads are spatially separated. As shown in FIGS. 10A and 10B, each chiplet also can have a third group of connection pads 25 in the center of the chiplet connected to a control buss; the first, second, and third groups of connection pads are spatially separated. In an alternative embodiment of the present invention, connection pads 24 for the row and column electrodes can be grouped into spatially separated groups (FIGS. 10A, 10B).

Chiplets can have a single row (e.g. FIG. 7B), or multiple rows (e.g. 2, FIG. 7C), of connection pads 24 along a long axis of the chiplet. Circuitry in the row driver chiplets can be different from the circuitry in the column driver chiplets. In particular, row drivers can employ very simple circuits with lower data rates but can switch large currents compared to a column driver. Moreover, the number of rows controlled by the row driver chiplet can be different from the number of columns driven by the column driver chiplet. Hence different circuits can be used in the different drivers, or even different manufacturing processes or technologies employed to make the different drivers.

Figure 8:
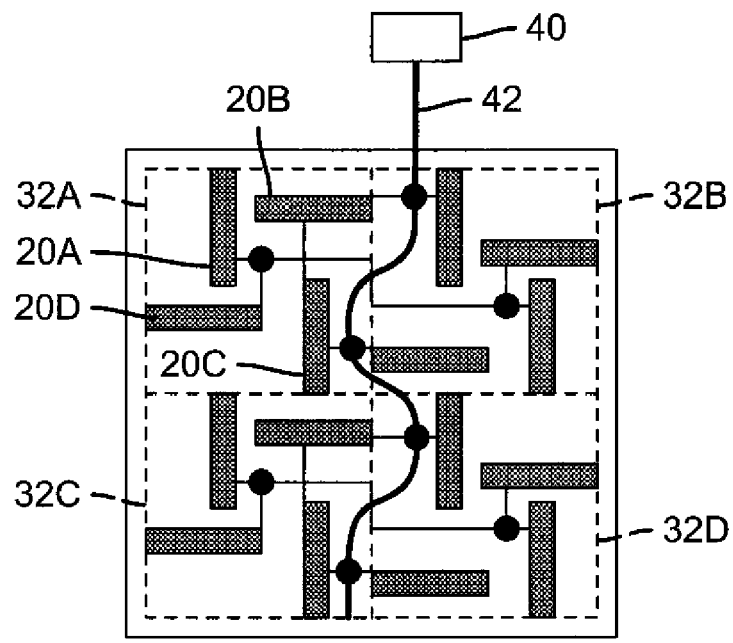
FIG. 8 is a schematic of a display device having multiple chiplets connected to a common, parallel-connected buss routed to avoid the chiplet devices according to another embodiment of the present invention.
Figure 9:
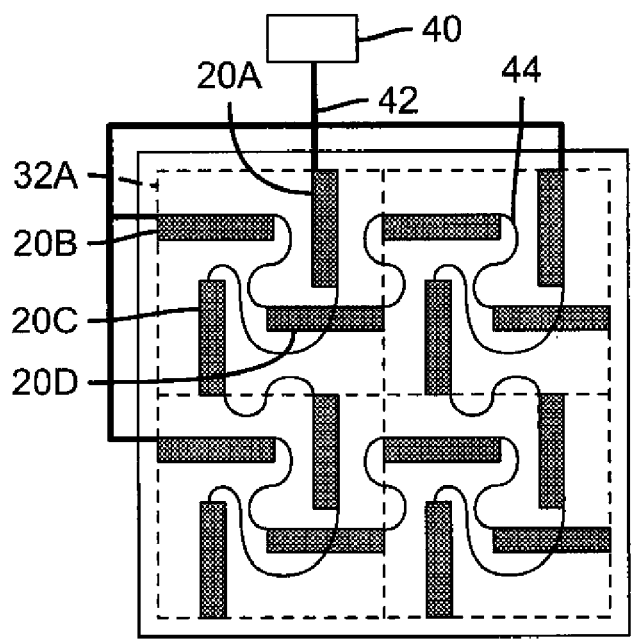
FIG. 9 is a schematic of a display device having multiple, serially-connected chiplets connected by a buss according to another embodiment of the present invention.

Referring to FIG. 8 in another embodiment of the present invention, the chiplets 20 can be connected to an external controller 40 through a buss 42. The buss 42 can be a serial, parallel, or point-to-point buss and can be digital or analog. A serial buss, shown in FIG. 9, is one in which data is re-transmitted from one chiplet to the next on electrically separated electrical connections; a parallel buss, shown in FIG. 8, is one in which data is simultaneously broadcast to all of the chiplets on an electrically common electrical connection. The buss 42 is connected to the chiplets to provide signals, such as power, ground, data, or select signals. More than one buss 42 separately connected to one or more controllers 40 can be employed. In FIG. 8, a chiplet arrangement corresponding to that shown in FIG. 3 is illustrated. This arrangement has the advantage of providing areas on the device substrate 10 that are not occupied with chiplets 10 and that can then be used for routing busses 42. For example, as shown in FIG. 8, the pixel connection areas of pixel arrays 32A, 32B, 32C, and 32D are only partially occupied with chiplets (e.g. 20A, 20B, 20C, and 20D in pixel array 32A). The remainder of the area within the pixel arrays can be employed for routing buss 42 wires. Hence, in some embodiments of the present invention, the busses can have a serpentine path. FIG. 8 illustrates an embodiment in which the buss 42 is connected in parallel to all of the chiplets. In an alternative embodiment shown in FIG. 9, buss 42 connections can be routed serially through row driver chiplets (e.g. 20A, 20C in pixel array 32A) and through column driver chiplets (e.g. 20B, 20D in pixel array 32A). Such buss arrangements can be useful when only a single metal layer is provided in the device for electrical connections, thereby reducing processing steps and improving manufacturing efficiency. Thus, a control buss can be located in a third layer separate from the first and second layers used for the row and column electrodes. Spaced-apart connection pads can have a pitch 23 (FIG. 10B) formed on the chiplets and openings formed through a planarization layer to expose the connection pads. The control buss can have a first portion that extends through the openings to the connection pads, and a separate second portion having a width greater than the pitch of the connection pads. Thus, the electrical resistance of the control buss can be lower in the areas between chiplets.

Figure 11:
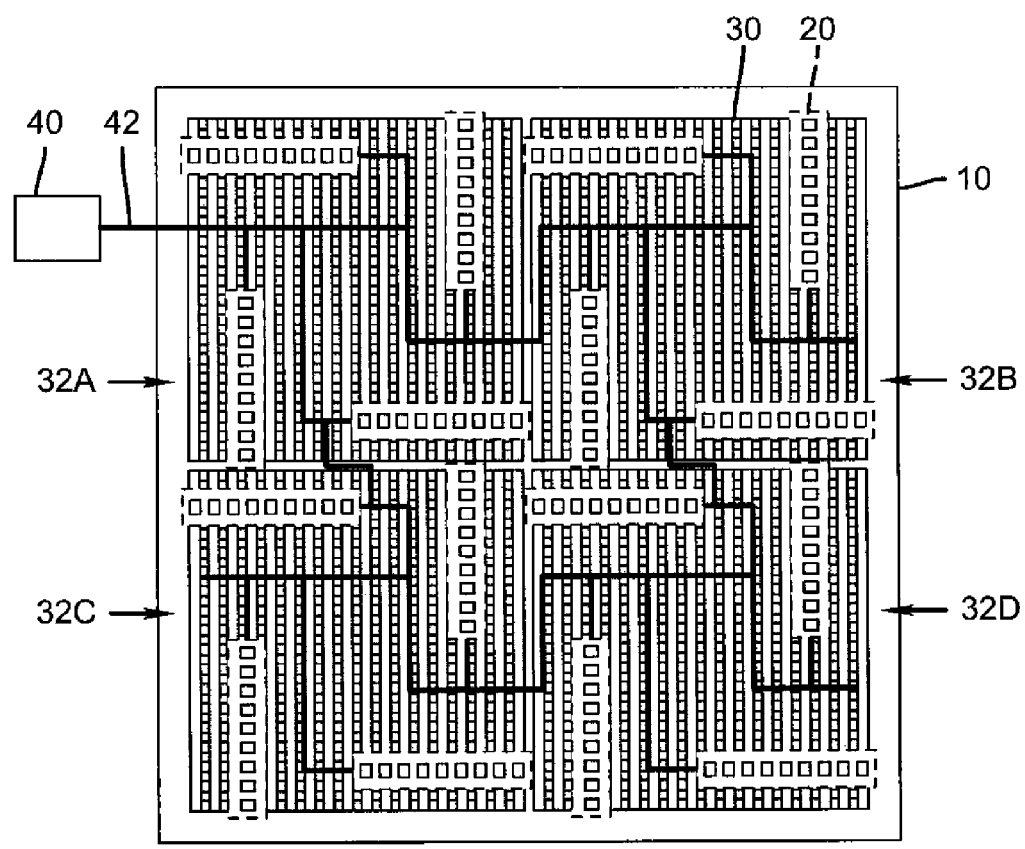
FIG. 11 is a schematic of multiple pixel groups with chiplet drivers according to an embodiment of the present invention.

Referring to FIG. 11, in a further embodiment of the present invention, a plurality of two-dimensional pixel arrays 32A-D of pixels can be located over a common substrate 10, each two-dimensional pixel array 32A-D having an electrically independent separate set of group row electrodes, an electrically independent separate set of group column electrodes, and chiplets 20. Hence, the structure described above (e.g. FIG. 3) can be replicated on a larger substrate 10. Each two-dimensional array structure can operate independently to reduce electrode impedance, precharge and discharge power consumption, and flicker. The structures can be connected to a common buss 42 (as shown). Thus, according to an embodiment of the present invention, a display device can include a substrate, a first layer having a plurality of electrically independent arrays of row electrodes formed in rows across the substrate in a first direction and a second layer having a corresponding plurality of electrically independent arrays of column electrodes formed in columns across the substrate in a second direction different from the first direction wherein the first and second electrodes overlap to form pixel locations, one or more layers of light-emitting material formed between the row and column electrodes to form a plurality of electrically independent two-dimensional arrays of pixels, the pixels being located in the pixel locations, a plurality of driver chiplets and a separate plurality of column driver chiplets for each electrically independent array distributed relative to the corresponding two-dimensional array of pixels, the chiplet layer having for each array located over the substrate a plurality of row driver chiplets and a separate plurality of column driver chiplets, each row driver chiplet exclusively connected to and controlling an independent set of row electrodes for the corresponding array and each column driver chiplet exclusively connected to and controlling an independent set of column electrodes for the corresponding array.

Figure 12:
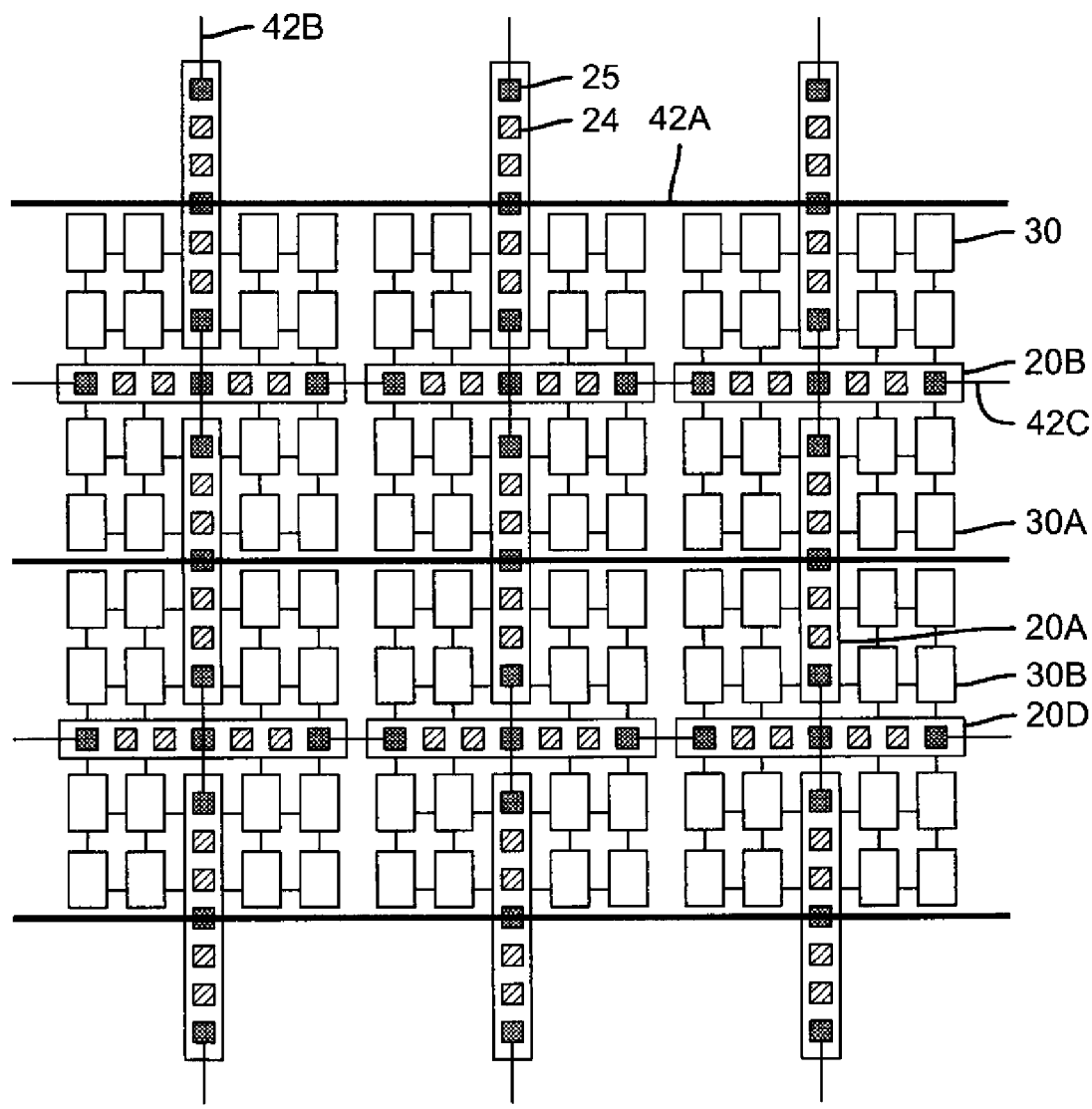
FIG. 12 is a partial schematic of multiple pixel groups with chiplet drivers according to another embodiment of the present invention.

Referring to FIG. 12, a partial schematic of an embodiment of the present invention employs chiplets having one row of connection pads arranged over a substrate. The pixels 30 are illustrated rather than the electrodes. The row driver chiplets 20A drive pixels. Half of the pixels 30A are driven by one column driver chiplet 20B and half of the pixels 30B are driven by another column driver chiplet 20D. Bus 42A is connected in parallel to all of the row driver chiplets in a row and buss 42B is connected to both row and column driver chiplets, passing through the row driver chiplets 20A and over the column driver chiplets 20B, 20D. Buss 42C passes through only the column driver chiplets. This arrangement has the advantage of locating the busses in a single layer.

Figure 13:
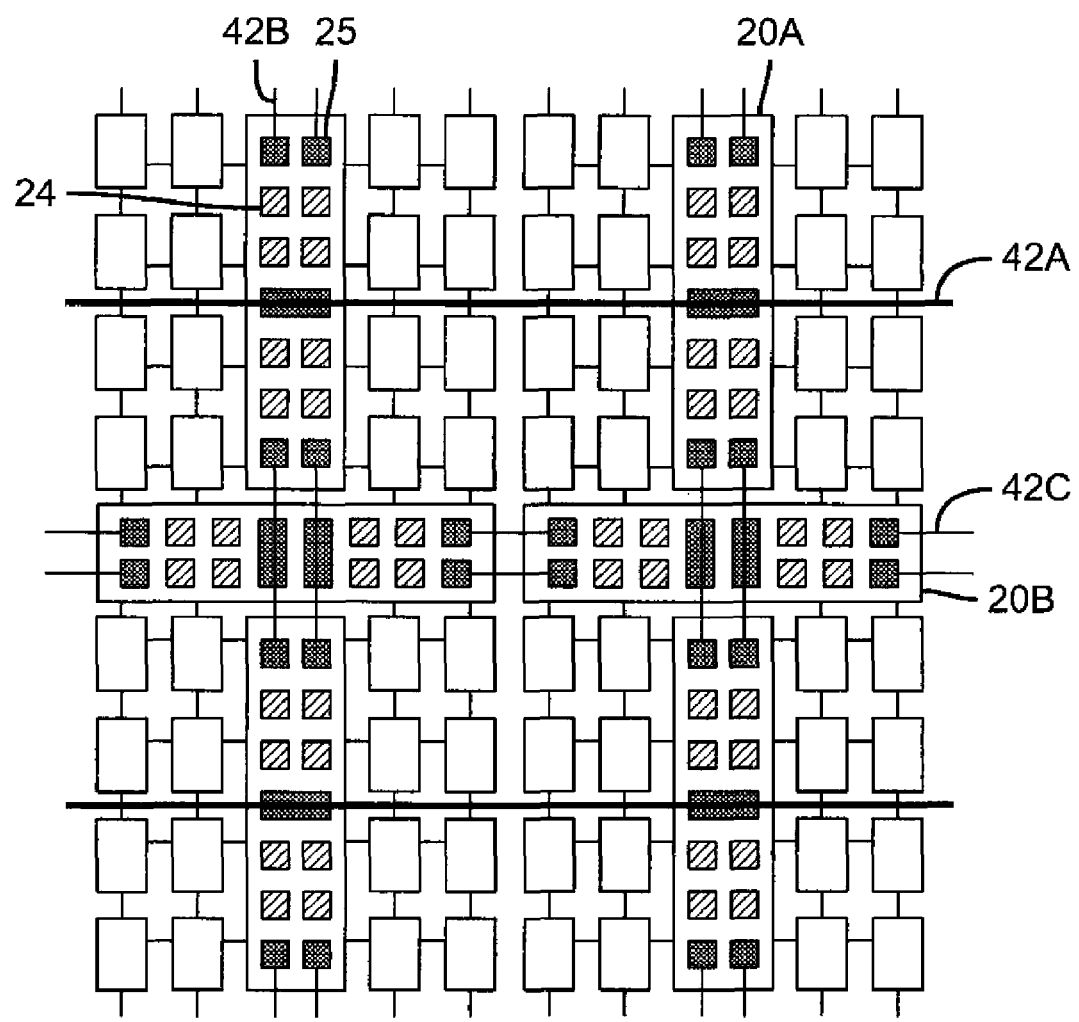
FIG. 13 is a partial schematic of multiple pixel groups with chiplet drivers according to yet another embodiment of the present invention.

Referring to FIG. 13, a partial schematic of an embodiment of the present invention employs chiplets having two rows of connection pads arranged over a substrate. As in FIG. 12, the pixels 30 are illustrated rather than the electrodes and the busses 42A, 42B, 42C are likewise connected. In this embodiment, the chiplets have two rows of connection pads. Each chiplet can drive multiple separate pixel groups and, as in FIG. 12, the pixels in a pixel group can be divided among different combinations of row and column drivers. This arrangement also has the advantage of locating the busses in a single layer.

In both FIGS. 12 and 13, the single layer of wiring is, at least partly, enabled by an electrical connection connected to a row driver chiplet and passing through a column driver chiplet. Alternatively, the electrical connection can be connected to a column driver chiplet and passing through a row driver chiplet. By 'connected to' is meant that the wire makes an electrical connection through a connection pad on a chiplet to circuitry within the chiplet. In contrast, an electrical connection passing through the chiplet is connected to a connection pad at one location on the chiplet, passes through circuitry in the chiplet, and re-emerges from a separate connection pad at a different location and different connection pad on the chiplet and connects to another chiplet. In this fashion, signals (e.g. clock, reset, power, ground) can be connected to all of the chiplets in an array of chiplets without conflicting with other signals connected in an orthogonal direction in the same wiring layer. For example, in FIGS. 12 and 13, buss 42A is routed in one direction and buss 42B is routed in an orthogonal direction in the same wiring layer. Buss 42A passes over buss 42B where buss 42B pass through a chiplet so that both busses 42A and 42B can be formed in the same wiring layer.

An additional advantage of these designs is that the wires can be patterned using low-cost methods since there is ample area available for the wiring. In the previously referenced chiplet design of commonly-assigned, above-cited U.S. patent application Ser. No. 12/191,462, the spacing of the pads on the chiplets was typically 20 um, requiring wiring alignment accuracy to within 5 um. This required that the back-plane wires and insulators be patterned with expensive fabrication equipment. In the present design, it is possible to use patterning methods to form the wiring and insulator layers that have much wider limits of variations—on the order of the size of a pixel. For example systems developed for printed circuit board fabrication use low-cost photo-masks and proximity exposure tools capable of making 25 um lines and 25 um spaces. These are much lower cost than TFT photo-masks and the TFT stepper exposure tools. This results in a backplane fabrication process requiring less capital expense, less operating expense, and reduced manufacturing cycle time.

Referring to FIG. 11, in operation, a controller 40 receives and processes an information signal according to the needs of the display device and transmits the processed signal through one or more busses 42 to each chiplet 20 (shown above the row and column electrodes for clarity) in the device. The processed signal includes luminance information for each light-emitting pixel element 30 corresponding to the associated row and column driver chiplets 20. The luminance information can be stored in a storage element 26 corresponding to each light-emitting pixel element 30. The chiplets then sequentially activate the row and column electrodes to which they are connected. When both the row and column electrode for a pixel is activated, current can flow through the pixel defined by the row and column electrode to emit light. Typically, an entire group of row electrodes or group of column electrodes within a pixel group is activated simultaneously by activating all of the group column electrodes and one row electrode at once (or vice versa). The column electrodes are controlled to provide the individual luminance desired for each pixel in the row. Then a second row is selected and the process repeats until all of the rows are activated and all of the pixels emit light. The process can then repeat. Separate pixel groups can function independently. Note that the designation of "row" and "column" is arbitrary and the functions of row and column electrodes can be reversed. Although FIG. 11 illustrates an embodiment in which every chiplet 20 is directly connected to a buss 42, an alternative embodiment can include a serial buss connection arrangement such as that illustrated in FIG. 9.

Although the sequential activation of separate rows (or columns) in a display device can induce flicker, employing multiple, independently controlled pixel groups 32 reduces the number of rows or columns in each separately controlled pixel group 32. Since the pixel groups 32 are simultaneously activated, flicker can be greatly reduced. Moreover, because the group row electrodes and group column electrodes are connected only within a pixel group 32, the group row electrodes and group column electrodes are short, reducing the electrode capacitance and resistance and the need for high-power driving circuitry in the chiplets 20, and the power consumption of the display is reduced. Hence, the portion of time that each pixel row (or column) emits light is increased, flicker is decreased, and current densities decreased at a desired luminance.

The busses 42 can supply a variety of signals, including timing (e.g. clock) signals, data signals, select signals, power connections, or ground connections. The signals can be analog or digital, for example digital addresses or data values. Analog data values can be supplied as charge. The storage elements 26 can be digital (for example including flip-flops) or analog (for example including capacitors for storing charge).

In various embodiments of the present invention, the row driver or column driver chiplets 20 distributed over the substrate 10 can be identical. However, a unique identifying value, i.e. an ID, can be associated with each chiplet 20. The ID can be assigned before or, preferably, after the chiplet 20 is located over the substrate 10 and the ID can reflect the relative position of the chiplet 20 on the substrate 10, that is, the ID can be an address. For example, the ID can be assigned by passing a count signal from one chiplet 20 to the next in a row or column. Separate row or column ID values can be used.

The controller 40 can be implemented as a chiplet and affixed to the substrate 10. The controller 40 can be located on the periphery of the substrate 10, or can be external to the substrate 10 and include a conventional integrated circuit.

According to various embodiments of the present invention, the chiplets 20 can be constructed in a variety of ways, for example with one or two rows of connection pads 24 along a long dimension of a chiplet 20 (FIGS. 7B, 7C). The interconnection busses 42 and wires 52 can be formed from various materials and can use various methods for deposition on the device substrate. For example, the interconnection busses 42 and wires 52 can be metal, either evaporated or sputtered, for example aluminum or aluminum alloys. Alternatively, the interconnection busses 42 and wires 52 can be made of cured conductive inks or metal oxides. In one cost-advantaged embodiment, the interconnection busses 42 and wires 52 are formed in a single layer.

The present invention is particularly useful for multi-pixel device embodiments employing a large device substrate, e.g. glass, plastic, or foil, with a plurality of chiplets 20 arranged in a regular arrangement over the device substrate 10. Each chiplet 20 can control a plurality of pixels 30 formed over the device substrate 10 according to the circuitry in the chiplet 20 and in response to control signals. Individual pixel groups or multiple pixel groups can be located on tiled elements, which can be assembled to form the entire display.

According to the present invention, chiplets 20 provide distributed pixel control elements over a substrate 10. A chiplet 20 is a relatively small integrated circuit compared to the device substrate 10 and includes circuit 22 including wires, connection pads, passive components such as resistors or capacitors, or active components such as transistors or diodes, formed on an independent substrate 28. Chiplets 20 are separately manufactured from the display substrate 10 and then applied to the display substrate 10. The chiplets 20 are preferably manufactured using silicon or silicon on insulator (SOI) wafers using known processes for fabricating semiconductor devices. Each chiplet 20 is then separated prior to attachment to the device substrate 10. The crystalline base of each chiplet 20 can therefore be considered a substrate 28 separate from the device substrate 10 and over which the chiplet circuitry 22 is disposed. The plurality of chiplets 20 therefore has a corresponding plurality of substrates 28 separate from the device substrate 10 and each other. In particular, the independent substrates 28 are separate from the substrate 10 on which the pixels 30 are formed and the areas of the independent, chiplet substrates 28, taken together, are smaller than the device substrate 10. Chiplets 20 can have a crystalline substrate 28 to provide higher performance active components than are found in, for example, thin-film amorphous or polycrystalline silicon devices. Chiplets 20 can have a thickness preferably of 100 um or less, and more preferably 20 um or less. This facilitates formation of the adhesive and planarization layer 18 over the chiplet 20 that can then be applied using conventional spin-coating techniques. According to one embodiment of the present invention, chiplets 20 formed on crystalline silicon substrates are arranged in a geometric array and adhered to a device substrate (e.g. 10) with adhesion or planarization materials. Connection pads 24 on the surface of the chiplets 20 are employed to connect each chiplet 20 to signal wires, power busses and row or column electrodes (16, 12) to drive pixels 30. Chiplets 20 can control at least four pixels 30.

Since the chiplets 20 are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. The chiplet 20, however, also requires connection pads 24 for making electrical connection to the wiring layer provided over the chiplets once assembled onto the display substrate 10. The connection pads 24 are sized based on the feature size of the lithography tools used on the display substrate 10 (for example 5 um) and the alignment of the chiplets 20 to the wiring layer (for example +/−5 um). Therefore, the connection pads 24 can be, for example, 15 um wide with 5 um spaces between the pads. The pads will therefore generally be significantly larger than the transistor circuitry formed in the chiplet 20.

The pads can generally be formed in a metallization layer on the chiplet over the transistors. It is desirable to make the chiplet with as small a surface area as possible to enable a low manufacturing cost.

By employing chiplets with independent substrates (e.g. including crystalline silicon) having circuitry with higher performance than circuits formed directly on the substrate (e.g. amorphous or polycrystalline silicon), a device with higher performance is provided. Since crystalline silicon has not only higher performance but also much smaller active elements (e.g. transistors), the circuitry size is reduced. A useful chiplet can also be formed using micro-electro-mechanical (MEMS) structures, for example as described in "A novel use of MEMS switches in driving AMOLED", by Yoon, Lee, Yang, and Jang, Digest of Technical Papers of the Society for Information Display, 2008, 3.4, p. 13.

The device substrate 10 can include glass and the wiring layers made of evaporated or sputtered metal or metal alloys, e.g. aluminum or silver, formed over a planarization layer (e.g. resin) patterned with photolithographic techniques known in the art. The chiplets 20 can be formed using conventional techniques well established in the integrated circuit industry.

The present invention can be employed in devices having a multi-pixel infrastructure. In particular, the present invention can be practiced with LED devices, either organic or inorganic, and is particularly useful in information-display devices. In a preferred embodiment, the present invention is employed in a flat-panel OLED device composed of small-molecule or polymeric OLEDs as disclosed in, but not limited to U.S. Pat. No. 4,769,292, to Tang et al., and U.S. Pat. No. 5,061,569, to VanSlyke et al. Inorganic devices, for example, employing quantum dots formed in a polycrystalline semiconductor matrix (for example, as taught in U.S. Patent Application Publication No. 2007/0057263 by Kahen), and employing organic or inorganic charge-control layers, or hybrid organic/inorganic devices can be employed. Many combinations and variations of organic or inorganic light-emitting displays can be used to fabricate such a device, including active-matrix displays having either a top- or a bottom-emitter architecture.

The invention has been described in detail with particular reference to certain preferred embodiments thereof, but it should be understood that variations and modifications can be effected within the spirit and scope of the invention.

PARTS LIST

D1 long dimension
D2 short dimension
10 substrate
12 column electrode
12A, 12B column electrode group
12C, 12D column electrode group
14 light-emitting layer
15 light-emitting diode
16 row electrode
16A, 16B row electrode group
16C, 16D row electrode group
18 planarization layer
20 chiplet
20A, 20C, 20E, 20G row driver chiplet
20B, 20D, 20F, 20H column driver chiplet
21A pixel connection portion
21B control circuit connection portion
22 circuitry
23 connection pad pitch
24 connection pad
24A row connection pad
24B column connection pad
25 buss connection pad
26 storage element
28 chiplet substrate
30, 30A, 30B pixel
32 pixel group
32A, 32B, 32C, 32D, pixel array
40 controller
42, 42A, 42B, 42C buss
44 internal chiplet connection
50 via
52 wire

The invention claimed is:

1. A display device, comprising:
a substrate;
a first layer comprising an array of row electrodes formed in rows across the substrate in a first direction;
a second layer comprising an array of column electrodes formed in columns across the substrate in a second direction different from the first direction, the row and column electrodes overlapping to form pixel locations;
one or more layers of light-emitting material formed between the row and column electrodes to form a two-dimensional array of pixels, the pixels being located in the pixel locations;
a plurality of row driver chiplets and a separate plurality of column driver chiplets distributed relative to the two-dimensional array of pixels, each row driver chiplet exclusively connected to and controlling an independent set of row electrodes, each column driver chiplet exclusively connected to and controlling an independent set of column electrodes;
circuitry in each row driver chiplet for controlling the row electrodes; and
circuitry in each column driver chiplet for controlling the column electrodes,
wherein the circuitry in each row driver chiplet is configured for lower data rates than the circuitry in each column driver chiplet.

2. The display device of claim 1, wherein each chiplet comprises a storage element for at least each pixel to which it is connected in a row or column, the storage element storing a value representing a desired luminance for each pixel and the chiplet using such value to control the row electrodes or column electrodes connected to the pixel.

3. The display device of claim 1, further comprising connection pads on each row driver chiplet or column driver chiplet, each connection pad connected to a separate row electrode or column electrode, respectively.

4. The display device of claim 3, wherein the number, location, or layout of the connection pads for the row driver chiplet is different from the number, location, or layout of the connection pads for the column driver chiplet.

5. The display device of claim 3, wherein the connection pads form a single or double row.

6. The display device of claim 3, wherein:
the row electrodes comprise a row pitch;
the column electrodes have a column pitch;
the chiplets have connection pad pitch; and
the connection pad pitch is the same as the row pitch or column pitch.

7. The display device of claim 1, further comprising one or more serial or parallel bus connections electrically connected to each chiplet.

8. The display device of claim 7, wherein:
a bus provides a power or ground electrical connection; or
a bus transmits a data signal or a control signal.

9. The display device of claim 1, further comprising:
a control bus,
wherein each chiplet comprises a first group of connection pads connected to the row and column electrodes and second group of connection pads connected to the control bus, and
wherein the first and second groups of connection pads are spatially separated.

10. The display device of claim 9, wherein:
each chiplet comprises a third group of connection pads connected to the control bus; and
wherein the first, second, and third groups of connection pads are spatially separated.

11. The display device of claim 9, wherein:
each chiplet further comprises a third group of connection pads connected to the row and column electrodes; and
the first, second, and third groups of connection pads are spatially separated.

12. The display device of claim 1, wherein:
the chiplet comprises a long dimension and a short dimension; and
the long dimension is parallel to the first or second direction.

13. The display device of claim 1, further comprising:
a third layer separate from the first and second layers; and
a control bus located in the third layer.

14. The display device of claim 13, further comprising:
spaced-apart connection pads comprising:
a pitch formed on the chiplets; and
openings formed to expose the connection pads,
wherein the control bus comprises:
a first portion that extends through the openings to the connection pads, and
a separate second portion comprising a width greater than the pitch of the connection pads.

15. The display device of claim 1, wherein:
the row driver chiplets and the column drive chiplets have a different size; or
the number of row driver chiplets is different from the number of column driver chiplets; or
the number of rows controlled by the row driver chiplet is different from the number of columns driven by the column driver chiplet.

16. The display device of claim 1, further comprising:
an electrical connection connected to a row driver chiplet and passing through a column driver chiplet; or
an electrical connection connected to a column driver chiplet and passing through a row driver chiplet.

17. A display device, comprising:
a substrate;
a first layer comprising a plurality of electrically independent arrays of row electrodes formed in rows across the substrate in a first direction;
a second layer comprising a corresponding plurality of electrically independent arrays of column electrodes formed in columns across the substrate in a second direction different from the first direction, the first and second electrodes overlapping to form pixel locations;
one or more layers of light-emitting material formed between the row and column electrodes to form a plurality of electrically independent two-dimensional arrays of pixels, the pixels being located in the pixel locations;
a chiplet layer comprising a plurality of row driver chiplets and a separate plurality of column driver chiplets for each electrically independent array distributed relative to the corresponding two-dimensional array of pixels, each row driver chiplet exclusively connected to and controlling an independent set of row electrodes for the corresponding array and each column driver chiplet exclusively connected to and controlling an independent set of column electrodes for the corresponding array;
circuitry in each row driver chiplet for controlling the row electrodes; and
circuitry in each column driver chiplet for controlling the column electrodes,
wherein the circuitry in each row driver chiplet is configured for lower data rates than each circuitry in the column driver chiplet.

18. A display device, comprising:
a substrate comprising a display area;
a plurality of row electrodes formed over the substrate in the display area extending in a row direction and a plurality of column electrodes formed over the substrate in the display area extending in a column direction different from the row direction, the row and column electrodes overlapping to form pixels, the pixels being divided into two or more separate pixel groups, each pixel group comprising group row electrodes and separate group column electrodes;
two or more spaced column driver chiplets located in the display area, each column driver chiplet uniquely connected to a different pixel group, at least one of the column driver chiplets being located between pixel groups, the two or more spaced column driver chiplets being adapted to drive the group column electrodes of the one pixel group;
one or more row drivers connected to the row electrodes, the row drivers and the column driver chiplets cooperatively driving the row and column electrodes, respectively, to activate the pixels;
circuitry in each row driver chiplet for controlling the row electrodes; and
circuitry in each column driver chiplet for controlling the column electrodes,
wherein the circuitry in each row driver chiplet is configured for lower data rates than the circuitry in each column driver chiplet.

19. The display device of claim 18, wherein at least one row driver comprises a chiplet located in the display area between pixel groups.

20. The display device of claim 18, wherein two or more separate pixel groups comprise separate group row electrodes.

21. The display device of claim 18, wherein two or more separate pixel groups comprise group row electrodes in common.

22. The display device of claim 18, wherein:
the row drivers comprise a long side aligned with column electrodes; and
the column driver chiplets comprise a long side aligned with row electrodes.

23. The display device of claim 18, wherein:
the display device comprises a top-emitter device; and
the column driver chiplets are located in a layer beneath the row and column electrodes.

24. A display device, comprising:
a substrate comprising a display area;
two or more column driver chiplets, each column driver chiplet comprising a long axis and being located over the substrate in the display area, the long axis of each column driver chiplet oriented in a row direction; and
one or more row driver chiplets, each row driver chiplet comprising a long axis and being located over the substrate in the display area, the long axis of each row driver chiplet oriented in a column direction different from the row direction;
circuitry in each row driver chiplet for controlling the row electrodes; and
circuitry in each column driver chiplet for controlling the column electrodes,
wherein the circuitry in each row driver chiplet is configured for lower data rates than the circuitry in each column driver chiplet.

25. The display device of claim 24, further comprising:
row and column electrodes formed in different directions over the display area; and
a light-emitting layer between the areas where the row and column electrodes overlap, defining a pixel responsive to current provided by the overlapping row and column electrodes to emit light,
wherein each column electrode is connected to one column driver chiplet, and
wherein each row electrode is connected to one row driver chiplet.

26. The display device of claim 24, wherein the row direction and the column direction are orthogonal.

27. The display device of claim 24, further comprising a pass-through bus configured to:
connect to a column driver chiplet at a first connection pad;
pass through the column driver chiplet; and
connect to a second connection pad of the column driver chiplet.

* * * * *